United States Patent
Sun et al.

(10) Patent No.: US 10,237,933 B2
(45) Date of Patent: Mar. 19, 2019

(54) VISIBLE LIGHT COMMUNICATION LED HAVING A SPIRAL INDUCTANCE COIL AND A CIRCLE CORE AND PREPARATION METHOD THEREOF

(71) Applicant: South China Normal University, Guangzhou, Guangdong (CN)

(72) Inventors: Huiqing Sun, Guangdong (CN); Xian Yang, Guangdong (CN); Zhiyou Guo, Guangdong (CN); Yong Huang, Guangdong (CN); Hongyong Huang, Guangdong (CN); Jie Sun, Guangdong (CN); Jing Huang, Guangdong (CN); Zhuding Zhang, Guangdong (CN); Yang Liu, Guangdong (CN)

(73) Assignee: SOUTH CHINA NORMAL UNIVERSITY, Guangzhou, Guangdong (CN)

( * ) Notice: Subject to any disclaimer, the term of this patent is extended or adjusted under 35 U.S.C. 154(b) by 0 days.

(21) Appl. No.: 15/490,065

(22) Filed: Apr. 18, 2017

(65) Prior Publication Data

US 2018/0103516 A1    Apr. 12, 2018

(30) Foreign Application Priority Data

Oct. 11, 2016    (CN) .......................... 2016 1 0886147

(51) Int. Cl.
*H05B 33/08* (2006.01)
*H01L 27/15* (2006.01)
(Continued)

(52) U.S. Cl.
CPC ......... *H05B 33/0821* (2013.01); *H01L 27/15* (2013.01); *H01L 28/10* (2013.01);
(Continued)

(58) Field of Classification Search
None
See application file for complete search history.

(56) References Cited

U.S. PATENT DOCUMENTS

| 8,629,654 B2 * | 1/2014 | Partovi | ................... H01F 5/003 320/108 |
| 2009/0021181 A1 * | 1/2009 | Brune | .................. B60Q 1/0023 315/291 |
| 2009/0184468 A1 * | 7/2009 | Huang | ................ A63F 3/00643 273/237 |
| 2011/0012155 A1 * | 1/2011 | Huang | ................ H01L 33/0095 257/98 |

(Continued)

OTHER PUBLICATIONS

Non-Final Rejection from U.S. Appl. No. 15/490,065, filed Dec. 13, 2017.*

*Primary Examiner* — Telly Green
(74) *Attorney, Agent, or Firm* — Muncy, Geissler, Olds & Lowe, P.C.

(57) ABSTRACT

A visible light communication LED having a spiral inductance coil and a circular core is provided, comprising a sapphire substrate provided with a positive electrode welding spot and a negative electrode welding spot, and a plurality of LED cores deposited on the sapphire substrate. The negative electrode of a former core is connected with the positive electrode of a latter core, and the positive electrode of the first core and the negative electrode of the last core are respectively connected to the positive electrode welding spot and the negative electrode welding spot on the substrate. According to the present invention, each of the LED cores is surrounded by a spiral inductance coil, and a pin of one end of the spiral inductance coil is connected via a connecting wire with the negative electrode of an adjacent LED core, while the other end is directly connected with the positive electrode of the LED core that is surrounded by the spiral inductance coil.

6 Claims, 2 Drawing Sheets

(51) Int. Cl.

| | |
|---|---|
| *H01L 33/08* | (2010.01) |
| *H01L 33/32* | (2010.01) |
| *H01L 49/02* | (2006.01) |
| *H01L 33/00* | (2010.01) |
| *H01L 33/38* | (2010.01) |
| *H01L 33/06* | (2010.01) |
| *H01L 33/12* | (2010.01) |
| *H01L 33/42* | (2010.01) |
| *H04B 10/50* | (2013.01) |
| *H01L 33/62* | (2010.01) |
| *H01L 33/44* | (2010.01) |
| *H04B 10/116* | (2013.01) |
| *H01L 33/20* | (2010.01) |

(52) U.S. Cl.
    CPC ........ *H01L 33/007* (2013.01); *H01L 33/0095* (2013.01); *H01L 33/06* (2013.01); *H01L 33/08* (2013.01); *H01L 33/12* (2013.01); *H01L 33/20* (2013.01); *H01L 33/32* (2013.01); *H01L 33/38* (2013.01); *H01L 33/42* (2013.01); *H04B 10/116* (2013.01); *H04B 10/502* (2013.01); *H01L 33/44* (2013.01); *H01L 33/62* (2013.01); *H01L 2933/0016* (2013.01)

(56) References Cited

U.S. PATENT DOCUMENTS

2012/0256585 A1* 10/2012 Partovi .................. H01F 5/003
                                                                320/108

* cited by examiner

VISIBLE LIGHT COMMUNICATION LED HAVING A SPIRAL INDUCTANCE COIL AND A CIRCLE CORE AND PREPARATION METHOD THEREOF

FIELD OF THE INVENTION

The present invention relates to visible light communication and in particular to a visible light communication LED having a spiral inductance coil and a circle core, and a preparing method thereof.

BACKGROUND OF THE INVENTION

Visible light is a part of electromagnetic spectrum that can be sensed by human eyes. There is no accurate scope for visible spectrum. In general, the wavelength of electromagnetic wave that can be sensed by human eyes is 400 nm-700 nm. Normal human eyes are most sensitive to electromagnetic wave with the wavelength of about 555 nm, which lies in green band.

Visible light communication technology is a wireless optical communication technology that is developed following the development of light emitting diode (LED) lighting technology. In comparison with traditional wire transmission, visible light communication provides many advantages such as high transmission power, no electromagnetic interference and energy conservation. Therefore it gains widespread attention and research in the world. The emission system of visible light communication needs to meet double requirements of indoor illumination and communication, and the strength of communication signal is in direct proportion to the illumination intensity. Therefore, good communication and comfortable indoor illumination both request well-distributed indoor illumination.

The modulation bandwidth of LED core is a determinant factor for the channel capacity and transmission rate of visible light communication system. Because of the influence of many aspects such as modulation depth and volt-ampere characteristics, existing visible light communication device is still imperfect. For example, a single LED core provides low power, light output of the core itself is inhomogeneous, and parasitic capacitance produced by high frequency circuit accelerates signal attenuation, which leads to low response frequency and makes the modulation bandwidth unable to meet the requirements of visible light communication.

SUMMARY OF THE INVENTION

An object of the present invention is to overcome one of the above deficiencies in the art and provide a visible light communication LED having a spiral inductance coil and a circular core.

This and other objects and advantages of the present invention are achieved by the solutions described herein after.

A visible light communication LED having a spiral inductance coil and a circular core is provided, comprising a sapphire substrate provided with a positive electrode welding spot and a negative electrode welding spot, and a plurality of LED cores deposited on the sapphire substrate. The negative electrode of a former core is connected with the positive electrode of a latter core, and the positive electrode of the first core and the negative electrode of the last core are respectively connected to the positive electrode welding spot and the negative electrode welding spot on the substrate. According to the present invention, each of the LED cores is surrounded by a spiral inductance coil, and one end of the spiral inductance coil is connected with the negative electrode of a LED core that is surrounded by this spiral inductance coil, while the other end of this spiral inductance coil is connected with the positive electrode of an adjacent LED core.

Preferably, the visible light communication LED according to the present invention comprises sixteen LED cores which are configured to form a 4×4 matrix.

The sixteen LED cores, each having a voltage of 3V and through-current of 5-30 mA, making a total voltage of 16×3V=48V, are connected in series. Although this configuration increases resistance R of the whole device, it also reduces capacity C of the whole device to the same proportion, and reduces time constant in the circuit. In comparison with a core of a single annular structure, this configuration provides an increased response frequency and at the same time facilitates arrangement and manufacturing of the spiral inductance.

Preferably, the LED core comprises a GaN/InGaN epitaxial wafer. A transparent conductive layer is provided on a p-type layer of the epitaxial wafer. An annular positive electrode is provided on the transparent conductive layer. The core is divided into an inner annular emission region, a middle annular emission region and an outer annular emission region by the annular positive electrode.

Preferably, the inner annular emission region, the middle annular emission region and the outer annular emission region of the LED core are of the same area.

Preferably, the GaN/InGaN epitaxial wafer comprises from its bottom to top a buffer layer, an n-type layer, a multiple quantum well layer, and a p-type layer.

Preferably, the spiral inductance coil has an inductance value in the range of 20 nH-200 nH.

It has been demonstrated by experiments of the present invention that in a circuit having the frequency of 10 MHz-100 MHz, adding an inductance of 20 nH-200 nH can effectively reduce impedance in the circuit, slow down attenuation of output signals, increase response frequency of the visible light emitting device, and increase modulation bandwidth. Further, as the frequency increases, the capacity produced in the circuit increases, and the inductance required by resonance decreases gradually.

Preferably, the spiral inductance coil has the outer diameter of 300 μm×300 μm, the inner diameter of 170 μm×170 μm, the line width of 5 μm, and the line distance of 10 μm.

A preparation method for the above visible light communication LED having a spiral inductance coil and a circular core is also provided, comprising:

growing a plurality of independent GaN/InGaN epitaxial wafers on a sapphire substrate, and forming a positive electrode welding spot and a negative electrode welding spot on the substrate;

depositing a transparent conductive layer on a p-type layer of the epitaxial wafer by magnetron sputtering, and forming N annular positive electrodes on the transparent conductive layer, thereby providing a plurality of LED cores;

connecting the negative electrode of a former core with the positive electrode of a latter core, and connecting the positive electrode of the first core and the negative electrode of the last core respectively to the positive electrode welding spot and the negative electrode welding spot on the substrate, thereby allowing the plurality of LED cores to form a matrix, and connecting the plurality of LED cores in series;

evaporate plating a spiral inductance coil at the periphery of each of the LED cores;

connecting one end of the spiral inductance coil directly with the negative electrode of the LED core that is surrounded by the spiral inductance coil, and connecting a pin of the other end of the spiral inductance coil with the positive electrode of an adjacent LED core.

Preferably, growing a GaN/InGaN epitaxial wafer on a sapphire substrate comprises:

using trimethyl gallium, trimethyl indium and $NH_3$ as a Ga source, an In source and a N source respectively, and $SiH_4$ and $CP_2Mg$ as a n-type doping source and a p-type doping source, performing heat treatment at 1100° C. in a $H_2$ atmosphere on the sapphire substrate, growing a buffer layer at 550° C., heating to 1070° C. to grow a n-type layer of the epitaxial wafer, cooling to 760° C. to grow a quantum well layer, heating to 970° C. to grow a p-type layer, and annealing at 750° C. in a $N_2$ atmosphere.

Preferably, evaporate plating a spiral inductance coil at the periphery of a core comprises:

sputtering a layer of metal as a marker at the back side of the substrate according to a pre-determined position where the spiral inductance coil is to be installed;

sputtering a seed layer at the front side of the substrate, applying a photoresist, and evaporate plating the spiral inductance coil and an annular electrode after exposing and developing;

removing the photoresist, and removing the seed layer by dry etching;

sputtering another seed layer at the front side of the substrate, applying a photoresist, plating a pin of the spiral inductance coil after exposing and developing, removing the photoresist, and removing the seed layer by dry etching;

applying an insulation protective layer while keeping the pin of the inductance coil uncovered; and evaporate plating a metal connecting wire on the insulation protective layer, to respectively connect with the negative electrode of a former LED core and a pin of an outer end of a latter spiral inductance coil.

Preferably, the insulation protective layer is a silicon dioxide insulation protective layer.

The present invention provides the following advantages over the prior art:

1. Adding of the spiral inductance coil can reduce the impedance produced in the capacitive circuit of the LED core, which provides capacity compensating and wave filtering, and protects the circuit.

2. The spiral inductance coil has a micro structure, which is produced by etching together with the annular electrode and is connected with the cores, thus no additional compensating circuit is required.

3. The annular positive electrode is of a dual ring design dividing the light emitting region into three parts of the same area, which helps to increase carrier recombination and provide homogenous lighting.

4. Connecting sixteen cores in series increases its lighting capacity as compared to a lighting device of a single core, and at the same time provides homogenous lighting and good heat dissipating.

BRIEF DESCRIPTION TO THE DRAWINGS

LIST OF REFERENCE NUMBERS

Figure 1:
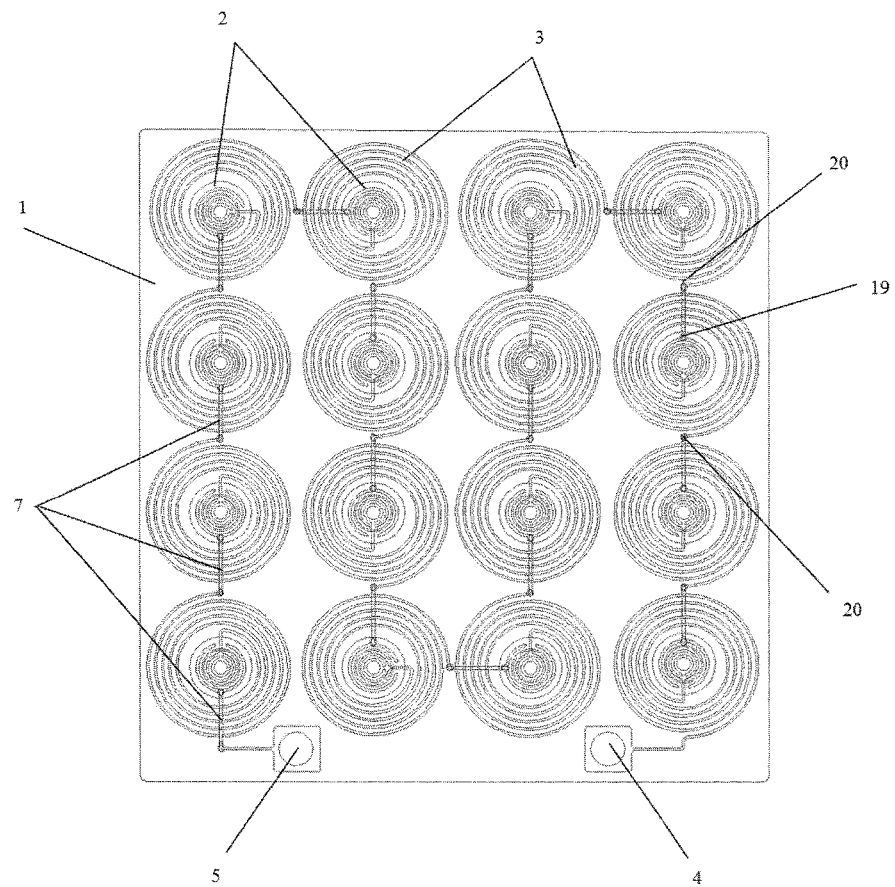
FIG. 1 shows a schematic view of the structure of the visible light communication LED device of Example 1 according to the present invention.
Figure 2:
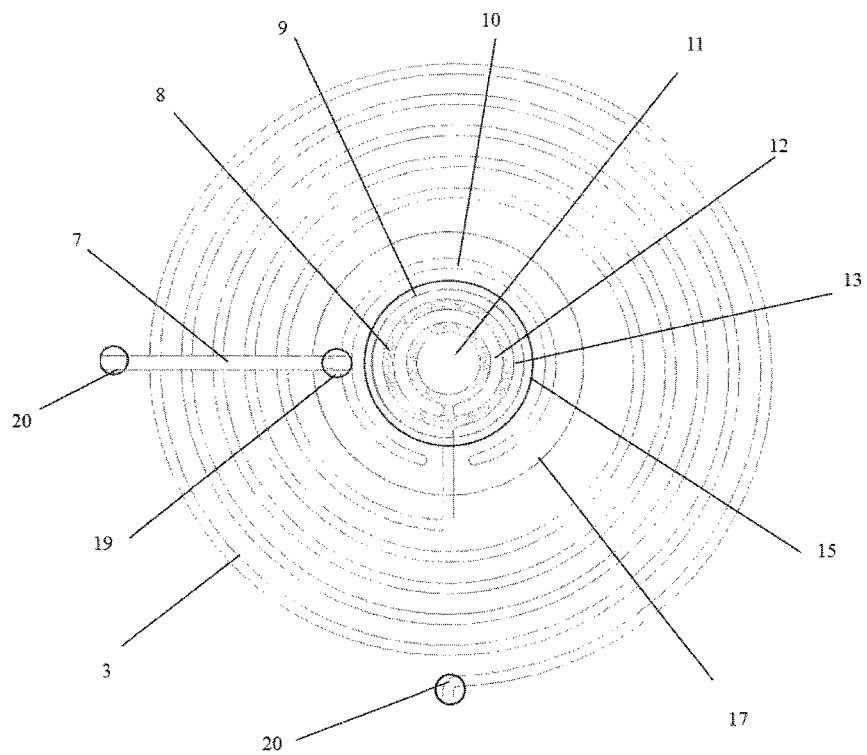
FIG. 2 shows a top view of the structure of a LED core.
Figure 3:
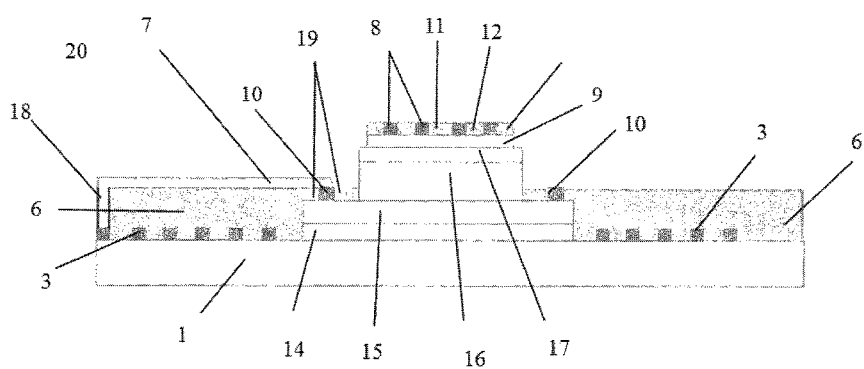
FIG. 3 shows a side view of the structure of a LED core.

1: Sapphire substrate of the epitaxial wafer
2: LED core
3: Spiral inductance coil
4: Positive electrode welding spot of the device
5: Negative electrode welding spot of the device
6: Silicon dioxide insulation protective layer
7: Connecting wire between the spiral inductance coil and the negative electrode of the core
8: Annular positive electrode
9: Transparent conductive layer
10: Annular negative electrode
11: Inner annular emission region
12: Middle annular emission region
13: Outer annular emission region
14: Buffer layer of the epitaxial wafer
15: N-type layer of the epitaxial wafer
16: Multiple quantum well layer of the epitaxial wafer
17: P-type layer of the epitaxial wafer
18: Pin of the outer end of the spiral inductance coil
19: Entrance of the connecting wire
20: Exit of the connecting wire

DETAILED DESCRIPTION OF THE INVENTION

The present invention will be described in conjugation with embodiments and figures.

Example 1

FIG. 1 shows a visible light communication LED having a spiral inductance coil and a circular core, comprising a sapphire substrate 1 provided with a positive electrode welding spot 4 and a negative electrode welding spot 5, and a plurality of LED cores 2 deposited on the sapphire substrate. The negative electrode 10 of a former core is connected with the positive electrode 8 of a latter core, and the positive electrode of the first core and the negative electrode of the last core are respectively connected to the positive electrode welding spot and the negative electrode welding spot on the substrate. Each of the LED cores is surrounded by a spiral inductance coil 3, and one end of the spiral inductance coil is connected with the negative electrode of the LED core that is surrounded by this spiral inductance coil, while the other end of this spiral inductance coil is connected with the positive electrode of an adjacent LED core.

The visible light communication LED of the present example comprises sixteen LED cores which are configured to form a 4×4 matrix.

The sixteen LED cores, each having a voltage of 3V and through-current of 5-30 mA, making a total voltage of 16×3V=48V, are connected in series. Although this configuration increases resistance R of the whole device, it also reduces capacity C of the whole device to the same proportion, and reduces time constant in the circuit. In comparison with a core of a single annular structure, this configuration provides an increased response frequency and at the same time facilitates arrangement and manufacturing of the spiral inductance.

The LED core comprises a GaN/InGaN epitaxial wafer. A transparent conductive layer 9 is provided on a p-type layer of the epitaxial wafer. An annular positive electrode 8 is provided on the transparent conductive layer. The core is divided into an inner annular emission region 11, a middle annular emission region 12 and an outer annular emission region 13 by the annular positive electrode.

The GaN/InGaN epitaxial wafer comprises from its bottom to top a buffer layer 14, an n-type layer 15, a multiple quantum well layer 16, and a p-type layer 17.

The spiral inductance coil has an inductance value in the range of 20 nH-200 nH.

It has been demonstrated by experiments of the present invention that in a circuit having the frequency of 10 MHz-100 MHz, adding an inductance of 20 nH-200 nH can effectively reduce impedance in the circuit, and increase response frequency of the visible light emitting device. Further, as the frequency increases, the inductance required by the resonance decreases gradually.

The spiral inductance coil has the outer diameter of 300 μm×300 μm, the inner diameter of 170 μm×170 μm, the line width of 5 μm, and the line distance of 10 μm.

Example 2

A preparation method for a visible light communication LED having a spiral inductance coil and a circular core is provided, comprising:

growing a plurality of independent GaN/InGaN epitaxial wafers on a sapphire substrate, and forming a positive electrode welding spot and a negative electrode welding spot on the substrate;

depositing a transparent conductive layer on a p-type layer of the epitaxial wafer by magnetron sputtering, and forming N annular positive electrodes on the transparent conductive layer, thereby providing a plurality of LED cores;

connecting the negative electrode of a former core with the positive electrode of a latter core, and connecting the positive electrode of the first core and the negative electrode of the last core respectively to the positive electrode welding spot and the negative electrode welding spot on the substrate, thereby allowing the plurality of LED cores to form a matrix, and connecting the plurality of LED cores in series;

evaporate plating a spiral inductance coil at the periphery of each of the LED cores;

connecting one end of the spiral inductance coil directly with the negative electrode of the LED core that is surrounded by this spiral inductance coil, and connecting a pin of the other end of this spiral inductance coil with the positive electrode of an adjacent LED core.

Growing a GaN/InGaN epitaxial wafer on a sapphire substrate comprises:

using trimethyl gallium, trimethyl indium and $NH_3$ as the Ga source, the In source and the N source respectively, and $SiH_4$ and $CP_2Mg$ as the n-type doping source and the p-type doping source, performing heat treatment at 1100° C. in a $H_2$ atmosphere on the sapphire substrate, growing a buffer layer at 550° C., heating to 1070° C. to grow a n-type layer of the epitaxial wafer, cooling to 760° C. to grow a quantum well layer, heating to 970° C. to grow a p-type layer, and annealing at 750° C. in a $N_2$ atmosphere.

Evaporate plating a spiral inductance coil at the periphery of a core comprises:

sputtering a layer of metal as a marker at the back side of the substrate according to a pre-determined position where the spiral inductance coil is to be installed;

sputtering a seed layer at the front side of the substrate, applying a photoresist, and evaporate plating the spiral inductance coil and an annular electrode after exposing and developing;

removing the photoresist, and removing the seed layer by dry etching;

sputtering another seed layer at the front side of the substrate, applying a photoresist, plating a pin of the spiral inductance coil after exposing and developing, removing the photoresist, and removing the seed layer by dry etching;

applying an insulation protective layer while keeping the pin of the inductance coil uncovered; and evaporate plating a metal connecting wire on the insulation protective layer, to respectively connect with the negative electrode of a former LED core and a pin of an outer end of a latter spiral inductance coil.

The insulation protective layer is a silicon dioxide insulation protective layer.

The invention claimed is:

1. A visible light communication LED, comprising
a sapphire substrate,
a plurality of LED cores deposited on the sapphire substrate and connected to each other in series, wherein each of the plurality of LED cores includes a negative electrode and a positive electrode, and
a plurality of spiral inductance coils disposed on the sapphire substrate, wherein each of the plurality of spiral inductance coils surrounds one of the plurality of LED cores and includes one end connected to the positive electrode of the one of the plurality of LED cores and another end connected to a negative electrode of the other one of the plurality of LED cores, which is next to the one of the plurality of LED cores.

2. The visible light communication LED according to claim 1, comprising sixteen LED cores which are configured to form a 4×4 matrix.

3. The visible light communication LED according to claim 1, wherein the LED core comprises a GaN/InGaN epitaxial wafer, a transparent conductive layer is provided on a p-type layer of the epitaxial wafer, an annular positive electrode is provided on the transparent conductive layer, and the core is divided into an inner annular emission region, a middle annular emission region and an outer annular emission region by the annular positive electrode.

4. The visible light communication LED according to claim 3, wherein the GaN/InGaN epitaxial wafer comprises from its bottom to top a buffer layer, an n-type layer, a multiple quantum well layer, and a p-type layer.

5. The visible light communication LED according to claim 1, wherein the spiral inductance coil has an inductance value in a range of 20 nH-200 nH.

6. The visible light communication LED according to claim 1, wherein the spiral inductance coil has an outer diameter of 300 μm×300 μm, an inner diameter of 170 μm×170 μm, a line width of 5 μm, and a line distance of 10 μm.

* * * * *